United States Patent [19]

Kawamoto

[11] Patent Number: 5,703,355

[45] Date of Patent: Dec. 30, 1997

[54] IMAGE SENSOR COVERED BY A PROTECTIVE FILM AND AN ORGANIC FILM TO DECREASE VARIATIONS IN SPECTRAL SENSITIVITY

[75] Inventor: Seiichi Kawamoto, Kanagawa, Japan

[73] Assignee: Sony Corporation, Tokyo, Japan

[21] Appl. No.: 593,107

[22] Filed: Feb. 1, 1996

Related U.S. Application Data

[63] Continuation of Ser. No. 230,147, Apr. 19, 1994, abandoned.

[30] Foreign Application Priority Data

Apr. 20, 1993 [JP] Japan .................. P05-116326

[51] Int. Cl.$^6$ .................. H01J 40/14; G01J 3/34
[52] U.S. Cl. .................. 250/214.1; 250/226; 250/208.1; 358/300
[58] Field of Search .................. 250/216, 208.1, 250/234, 235, 236, 226, 214.1

[56] References Cited

U.S. PATENT DOCUMENTS

| | | | |
|---|---|---|---|
| 4,395,629 | 7/1983 | Sasano et al. | 250/226 |
| 4,908,718 | 3/1990 | Shimada | 358/494 |
| 5,233,181 | 8/1993 | Kwansnick et al. | 250/208.1 |
| 5,288,989 | 2/1994 | Ishaque et al. | 250/214.1 |

*Primary Examiner*—Stephone B. Allen
*Attorney, Agent, or Firm*—Hill, Steadman & Simpson

[57] ABSTRACT

In a monochrome sensor, a sensor unit is covered with a protective film, and a light-transmitting organic film is formed on this protective film. Consequently, ripples in the spectral sensitivity characteristics are reduced. Even if the positions of the peaks and valleys of these ripples vary due to variations in the thicknesses of the protective film and the organic film or due to effective variations in these film thicknesses caused by the difference in the incident angle of light, a variation in the sensitivity at a given wavelength is small. This results in a small variation in the wavelength at which the maximum value of the spectral sensitivity is obtained and a small variation in the sensitivity derived from the difference in the incident angle of light.

16 Claims, 2 Drawing Sheets

IMAGE SENSOR COVERED BY A PROTECTIVE FILM AND AN ORGANIC FILM TO DECREASE VARIATIONS IN SPECTRAL SENSITIVITY

This is a continuation of application Ser. No. 08/230,147 filed Apr. 19, 1994 now abandoned.

BACKGROUND OF THE INVENTION

1. Field of the Invention

The present invention relates to a sensor for measuring the quantity of light without identifying its color.

2. Description of the Related Art

FIG. 1 is a schematic view showing one related art of a monochrome sensor. In this related art, a sensor unit 1 is formed on a semiconductor substrate, and a protective film 2 such as a plasma-SiN film is formed to cover the sensor unit 1. The protective film 2 has a thickness of about 0.75 μm to accomplish its protecting function, and light 3 is incident on the sensor unit 1 through this protective film 2. FIG. 2 is a graph showing the spectral sensitivity characteristics of this related art. Since the quantity of received light when the incident angle is 30° (3') is smaller than that when the incident angle is 0° (3) for the same light-receiving area, the sensitivity necessarily decreases when the incident angle is 30°.

As is apparent from FIG. 2, ripples are large in the spectral sensitivity characteristics of the related art illustrated in FIG. 1. The positions of the peaks and valleys of these ripples vary in accordance with the thickness of the overlying film of the sensor unit 1, i.e., the protective film 2 in this related art. If a peak changes into a valley or vice versa at a certain wavelength due to this variation, the sensitivity at that wavelength largely varies. For this reason, in the related art shown in FIG. 1, the wavelength at which the maximum value of the spectral sensitivity is obtained largely varies in accordance with the variation in the thickness of the protective film 2.

In addition, if the incident angle of the light 3 (3') with respect to the protective film 2 changes, the effective thickness of the protective film 2 also changes because the length of the optical path of the light 3 (3') in the protective film 2 varies. Consequently, as shown in FIG. 2, the sensitivity also varies greatly due to the difference in the incident angle of the light 3 (3'). As an example, when a light-emitting diode with a wavelength of 550 nm is used as a light source, the peak of a ripple when the incident angle is 0° changes into a valley when the incident angle is 30°. The result is a very large difference in the sensitivity.

OBJECTS AND SUMMARY OF THE INVENTION

It is the first object of the present invention to reduce variations in the wavelength at which the maximum value of the spectral sensitivity is obtained in a monochrome sensor using a solid-state image sensor.

It is the second object of the present invention to reduce variations in the sensitivity resulting from the difference in the incident angle of light which is incident on a solid-state image sensor in a monochrome sensor using the solid-state image sensor.

In a monochrome sensor according to claim 1, a light-transmitting film is formed on a protective film which covers at least a sensor unit.

In a monochrome sensor according to claim 2, an organic film is used as a light-transmitting film.

In the monochrome sensor according to claim 1, ripples in the spectral sensitivity characteristics are reduced compared with a sensor using no light-transmitting film.

In the monochrome sensor according to claim 2, the organic film is used as the light-transmitting film, and the thickness of this organic film can be increased without producing cracks. Consequently, by increasing the thickness of this light-transmitting film, it is possible to enhance the effect of reducing ripples in the spectral sensitivity characteristics.

DETAILED DESCRIPTION OF THE PREFERRED EMBODIMENTS

The first and second embodiments of the present invention will be described below with reference to FIGS. 3 to 5.

Figure 1:
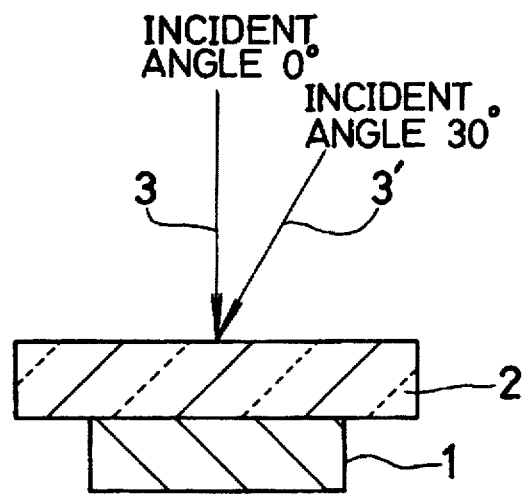
FIG. 1 is a schematic side sectional view showing a sensor of one related art of the present invention.
Figure 2:
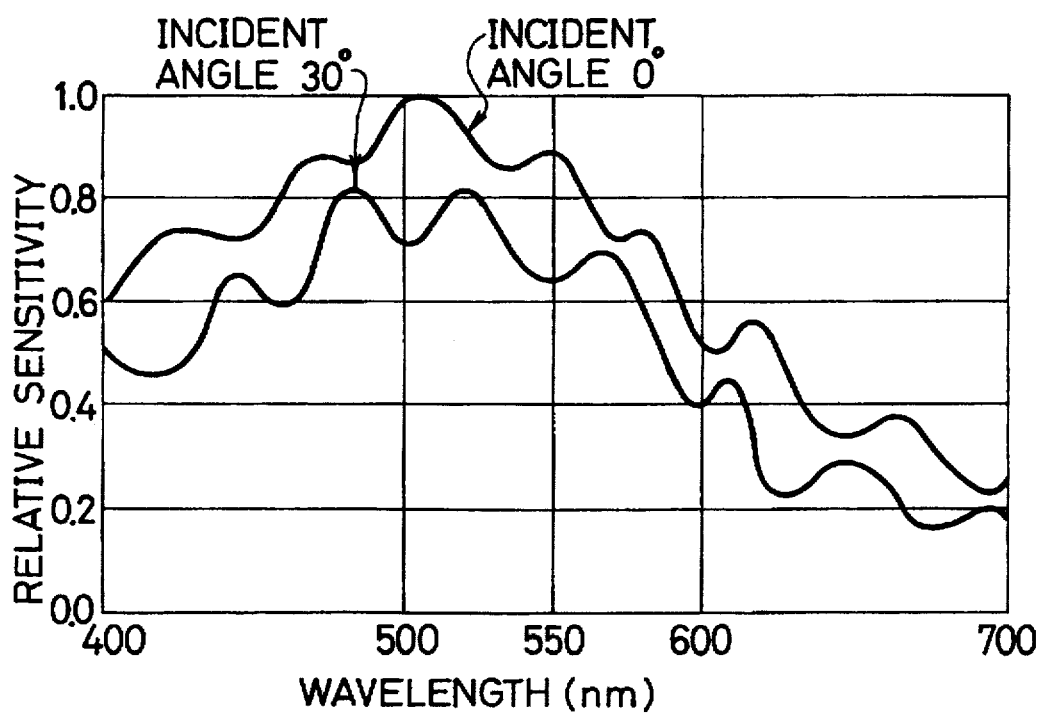
FIG. 2 is a graph showing the spectral sensitivity characteristics of the related art shown in FIG. 1.
Figure 3:
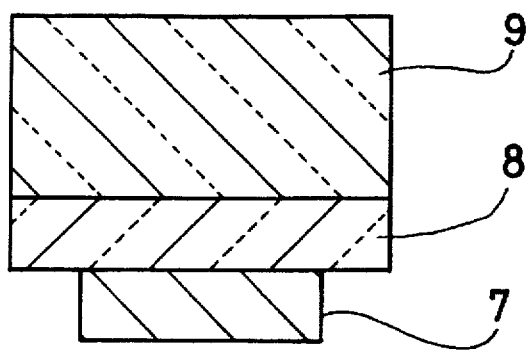
FIG. 3 is a schematic side sectional view showing a sensor according to the first embodiment of the present invention.

FIG. 3 shows the first embodiment of the present invention. In this first embodiment, an organic film 9 with a light-transmitting property is deposited to have a thickness of about 0.75 μm on a protective film 8, which is a plasma-SiN film or an $SiO_2$ film, by using a CVD process. This first embodiment has essentially the same arrangement as that of the related art illustrated in FIG. 1 except for this organic film 9.

The organic film 9 shown in FIG. 3 can be formed easily by coating a resin solution, which is prepared by dissolving a resin in a desired solvent, by using, e.g., a spin coating process, and removing the solvent by heating.

Examples of the solvent are ethylcellosolveacetate

diethyleneglycoldimethylether

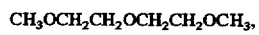

and ethyl lactate

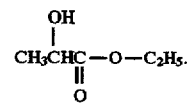

Examples of the resin are polyglycidylmethacrylate

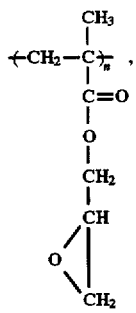

an acrylic acid/n-butyl acrylate/methyl methacrylate copolymer

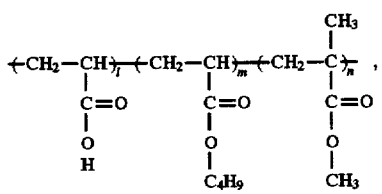

a styrene/chloromethylstyrene copolymer

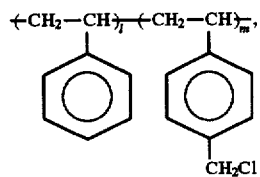

polyvinyl cinnamate

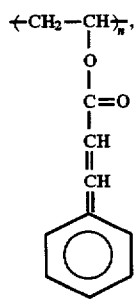

and novolak

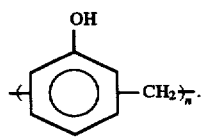

The resin solution used in the formation of the organic film is, if necessary, added with, e.g., a thermosetting agent, a photosensitive agent, a sensitizer, an ultraviolet absorbent, a surfactant, and a dye.

Examples of the thermosetting agent herein used are hexamethoxymethylmelamine

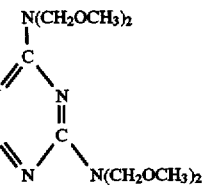

and neopentylglycoldiglycidylether

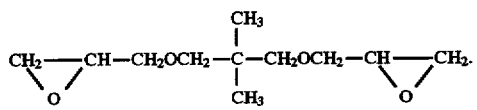

An example of the photosensitive agent is 2,3,4-trioxybenzophenone-3,4-bis[naphthoxy-1,2-diazido-5-sulfonic acid]ester

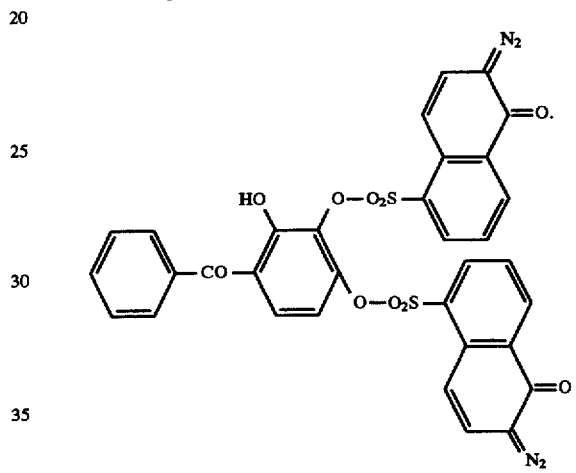

As the sensitizer, it is possible to use, e.g., nitroacenaphthene

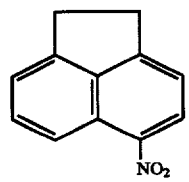

Figure 4:
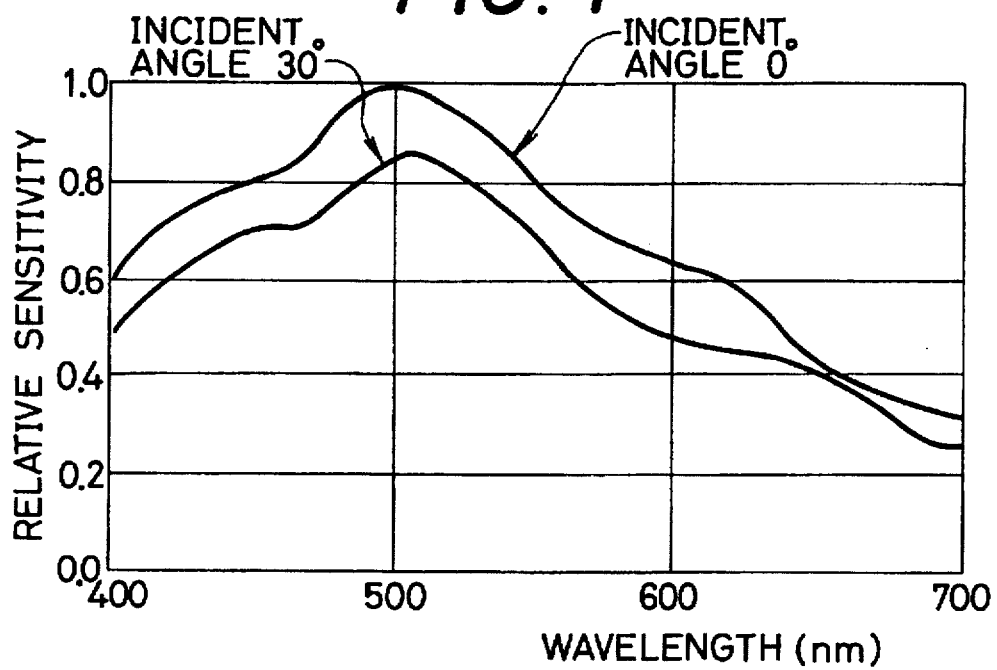
FIG. 4 is a graph showing the spectral sensitivity characteristics of the first embodiment shown in FIG. 3.

FIG. 4 is a graph showing the spectral sensitivity characteristics of the first embodiment. As can be seen from FIG. 4, ripples in the spectral sensitivity characteristics of this first embodiment are reduced compared with those of the related art illustrated in FIG. 1.

For this reason, even if the positions of the peaks and valleys of these ripples vary due to variations in the thicknesses of the overlying films of a sensor unit 7, i.e., the protective film 8 and the organic film 9 in this embodiment, a variation in the sensitivity at a certain wavelength is small since the differences between the peaks and valleys are originally small. Therefore, even if there are variations in the thicknesses of the protective film 8 and the organic film 9, a variation in the wavelength at which the maximum value of the spectral sensitivity is obtained is small. In addition, even if the effective thicknesses of the protective film 8 and the organic film 9 vary due to the difference in the incident angle of light, the resulting variation in the sensitivity is small.

Figure 5:
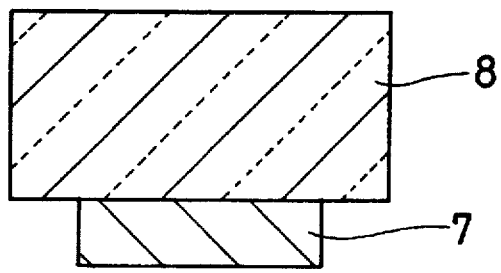
FIG. 5 is a schematic side sectional view showing a sensor according to the second embodiment of the present invention.

FIG. 5 shows the second embodiment of the present invention. This second embodiment has an arrangement essentially identical with that of the related art shown in FIG. 1 except that the thickness of a protective film 8 is large, about 1.5 μm. This film thickness is preferably 1.0 μm depending on the material of that film. In this second embodiment, a light-transmitting film consisting of plasma-SiN which is the same material as that of the protective film 8 is used instead of the organic film 9 in the first embodiment discussed above. Consequently, it is possible to obtain substantially the same spectral sensitivity characteristics as those of the above first embodiment.

Note that the effect of reducing ripples in the spectral sensitivity characteristics can be enhanced by increasing the thickness of the organic film 9 in the first embodiment, and by increasing the thickness of the protective film 8 in the second embodiment. However, increasing the thickness of the protective film 8 as the plasma-SiN film produces cracks. In contrast, the thickness of the organic film 9 can be increased without producing any cracks. In this respect, therefore, the first embodiment is more preferable than the second embodiment.

As has been described above, in the monochrome sensor according to the first embodiment, ripples in the spectral sensitivity characteristics are reduced. Therefore, even if variations are present in the thicknesses of the protective film and the light-transmitting film, a variation in the wavelength at which the maximum value of the spectral sensitivity is obtained is small. In addition, even if the effective thicknesses of the protective film and the light-transmitting film vary due to the difference in the incident angle of light, the consequent variation in the sensitivity is small.

In the monochrome sensor according to the second embodiment, the effect of reducing ripples in the spectral sensitivity characteristics can be enhanced by increasing the thickness of the light-transmitting film. This makes it possible to further decrease the variation in the wavelength at which the maximum value of the spectral sensitivity is obtained or the variation in the sensitivity resulting from the difference in the incident angle of light.

What is claimed is:

1. A monochrome sensor, wherein a light-transmitting film is formed directly on top of a protective film without any layers of intervening material disposed therebetween, the protective film covering at least a sensor unit without any layers of intervening material disposed therebetween, said light-transmitting film forming an external light-incident surface for said sensor without any layers of material disposed on top of the light-transmitting film, whereby variations in the wavelength of the maximum spectral sensitivity of said sensor are reduced by said light-transmitting film.

2. A sensor according to claim 1, wherein said light-transmitting film is an organic film.

3. A sensor according to claim 1, wherein said image sensor is formed by using a solid-state image sensor.

4. A sensor according to claim 2, wherein said image sensor is formed by using a solid-state image sensor.

5. A sensor according to claim 2, wherein a thickness of said light-transmitting film is not less than 1.0 μm.

6. A sensor according to claim 1, wherein said protective film is one of a plasma-SiN film and an $SiO_2$ film.

7. A sensor according to claim 1, wherein a thickness of said protective film is not more than 0.75 μm.

8. A sensor according to claim 1 wherein the light-transmitting film comprises an organic film comprising a resin selected from the group consisting of polyglycidylmethacrylate, an acrylic acid/n-butyl acrylate/methacrylate copolymer, a styrene/chloromethylstyrene copolymer, polyvinyl cinnamate and novalak.

9. A sensor according to claim 8 wherein the light-transmitting film is formed on top of the protective film by spin coating a solution of the resin dissolved in a solvent selected from the group consisting of ethylcellosolveacetate, diethyleneglycoldimethylether and ethyl lactate followed by removing the solvent with heat.

10. A monochrome sensor comprising:

a sensor unit, a protective film disposed directly on top of the upper surface of the sensor unit, an organic light-transmitting film disposed directly on top of the protective film, the organic light-transmitting film being directly exposed to light and providing a light-incident surface without any intervening layers disposed on top of the organic light-transmitting film, the organic light-transmitting film comprising a resin, the organic light-transmitting film reducing variations in the wavelength of the maximum spectral sensitivity of the sensor.

11. A sensor according to claim 10 the resin is selected from the group consisting of polyglycidylmethacrylate, an acrylic acid/n-butyl acrylate/methacrylate copolymer, a styrene/chloromethylstyrene copolymer, polyvinyl cinnamate and novalak.

12. A sensor according to claim 11 wherein the light-transmitting film is formed on top of the protective film by spin coating a solution of the resin dissolved in a solvent selected from the group consisting of ethylcellosolveacetate, diethyleneglycoldimethylether and ethyl lactate followed by removing the solvent with heat.

13. A sensor according to claim 10, wherein said monochrome sensor is formed by using a solid-state image sensor.

14. A sensor according to claim 10, wherein a thickness of said light-transmitting film is not less than 1.0 μm.

15. A sensor according to claim 10, wherein said protective film is selected from the group consisting of a plasma SiN film and a $SiO_2$ film.

16. A sensor according to claim 10, wherein a thickness of said protective film is not more than 0.75 μm.

* * * * *